(12) United States Patent
Cho et al.

(10) Patent No.: US 9,692,018 B2
(45) Date of Patent: Jun. 27, 2017

(54) ORGANIC LIGHT EMITTING DISPLAY APPARATUS REDUCING REFLECTION OF EXTERNAL LIGHT

(71) Applicant: Samsung Display Co., Ltd., Yongin (KR)

(72) Inventors: Sanghwan Cho, Yongin (KR); Chungsock Choi, Yongin (KR); Seunghun Kim, Yongin (KR); Cheol Jang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 92 days.

(21) Appl. No.: 14/699,258

(22) Filed: Apr. 29, 2015

(65) Prior Publication Data

US 2016/0079567 A1 Mar. 17, 2016

(30) Foreign Application Priority Data

Sep. 11, 2014 (KR) .................. 10-2014-0120212

(51) Int. Cl.
*H01L 29/08* (2006.01)
*H01L 51/52* (2006.01)
*H01L 27/32* (2006.01)

(52) U.S. Cl.
CPC ...... *H01L 51/5281* (2013.01); *H01L 51/5284* (2013.01); *H01L 27/323* (2013.01);
(Continued)

(58) Field of Classification Search
CPC .................. H01L 51/5281; H01L 51/5284
See application file for complete search history.

(56) References Cited

U.S. PATENT DOCUMENTS 8,536,781 B2 9/2013 Lee et al.
8,866,170 B2 10/2014 Moon et al.
(Continued)

FOREIGN PATENT DOCUMENTS

KR 10-2011-0049476 5/2011
KR 10-2012-0042438 5/2012
(Continued)

*Primary Examiner* — Matthew Gordon
(74) *Attorney, Agent, or Firm* — H.C. Park & Associates, PLC

(57) ABSTRACT

An organic light emitting display apparatus includes: a substrate divided into an emission area and a non-emission area; a pixel electrode disposed in the emission area; an intermediate layer disposed on the pixel electrode, including an organic emission layer; a counter electrode covering the intermediate layer; an external light reflection layer disposed on the counter electrode, the external light reflection layer being configured to reflect a portion of incident visible rays; and absorb and transmit another portion of the incident visible rays; a phase control layer disposed between the counter electrode and the external light reflection layer, being configured to control a phase of a light reflected by the counter electrode to destructive interfere with light reflected by the external light reflection layer; a thin-film encapsulating layer disposed on the external light reflection layer; and a black matrix disposed on the thin-film encapsulating layer in the non-emission area.

16 Claims, 9 Drawing Sheets

(52) U.S. Cl.
CPC ...... *H01L 51/5253* (2013.01); *H01L 51/5256* (2013.01); *H01L 2251/5338* (2013.01); *H01L 2251/558* (2013.01)

(56) References Cited

U.S. PATENT DOCUMENTS

2007/0222923 A1* 9/2007 Wang ................ G02F 1/136209
349/110
2015/0187857 A1* 7/2015 Negishi ............... H01L 27/3272
257/40

FOREIGN PATENT DOCUMENTS

| KR | 10-2012-0089950 | 8/2012 |
| KR | 10-2013-0037445 | 4/2013 |

* cited by examiner

ORGANIC LIGHT EMITTING DISPLAY APPARATUS REDUCING REFLECTION OF EXTERNAL LIGHT

CROSS-REFERENCE TO RELATED APPLICATION

This application claims priority from and the benefit of Korean Patent Application No. 10-2014-0120212, filed on Sep. 11, 2014, which is hereby incorporated by reference for all purposes as if fully set forth herein.

BACKGROUND

Field

Exemplary embodiments relate to organic light emitting display apparatuses.

Discussion of the Background

An organic light emitting display apparatus is a self-luminescent display apparatus including an organic light emitting device that includes an hole injection electrode, an electron injection electrode, and an organic emission layer formed therebetween, where light emitted as excitons are switched from an excited state to a ground state. The excitons are generated as holes injected from the hole injection electrode and electrons injected from the electron injection electrode are combined at the organic emission layer. Since an organic light emitting display apparatus, which is a self-luminescent display apparatus, does not need a separate light source, the organic light emitting display apparatus may be driven at a low voltage, may have relatively small size, and may exhibit improved characteristics in viewing angle, contrast, and response time. Therefore, organic light emitting display apparatuses have been applied to wide range of products, including portable devices, such as MP3 players, mobile phones, and televisions (TVs).

Research has been devoted to implement an organic light emitting display apparatus as a flexible display apparatus, such as a foldable display apparatus, a rollable display apparatus, or the like. Some conventional organic light emitting display devices, however, utilize a circular polarization film to improve visibility. These circular polarization films typically have a thickness of about 100 μm or greater, and, therefore, the circular polarization film may reduce the flexibility of an organic light emitting display apparatus.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light emitting display apparatus having improved visibility and flexibility.

Additional aspects will be set forth in the detailed description which follows, and, in part, will be apparent from the disclosure, or may be learned by practice of the inventive concept.

According to exemplary embodiments, an organic light emitting display apparatus includes a substrate divided into an emission area and a non-emission area; a pixel electrode disposed in the emission area; an intermediate layer disposed on the pixel electrode, the intermediate layer including an organic emission layer; a counter electrode disposed in the emission area and the non-emission area, the counter electrode covering the intermediate layer; an external light reflection layer disposed on the counter electrode in the emission area and the non-emission area, the external light reflection layer being configured to reflect a portion of incident visible rays; and absorb and transmit another portion of the incident visible rays; a phase control layer disposed between the counter electrode and the external light reflection layer, the phase control layer being configured to control a phase of a light reflected by the counter electrode to destructive interfere with light reflected by the external light reflection layer; a thin-film encapsulating layer disposed on the external light reflection layer; and a black matrix disposed on the thin-film encapsulating layer in the non-emission area.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
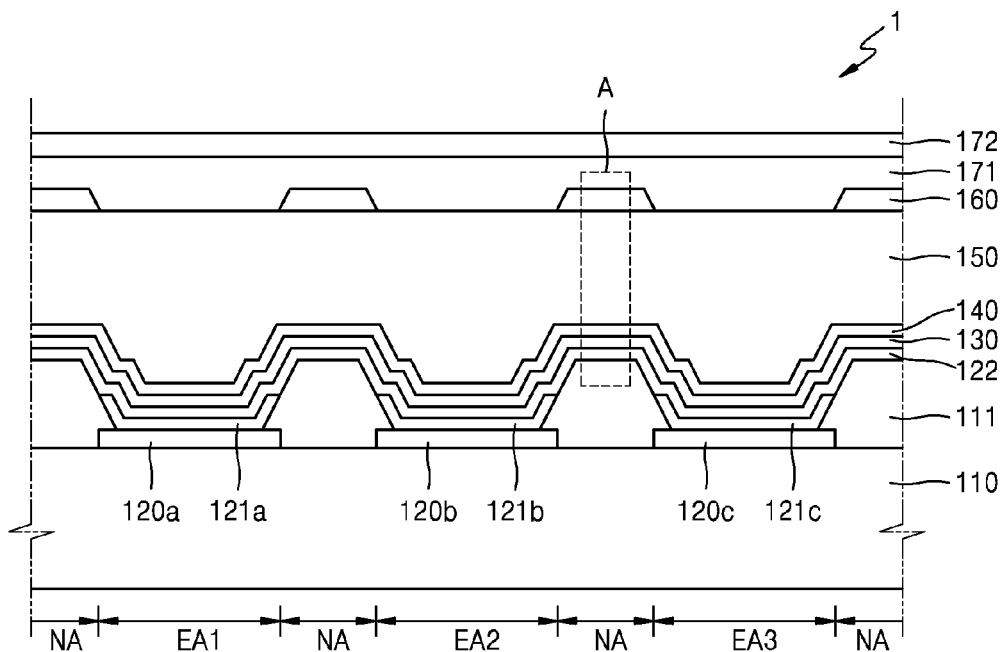
FIG. 1 is a schematic sectional view of an organic light emitting display apparatus, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
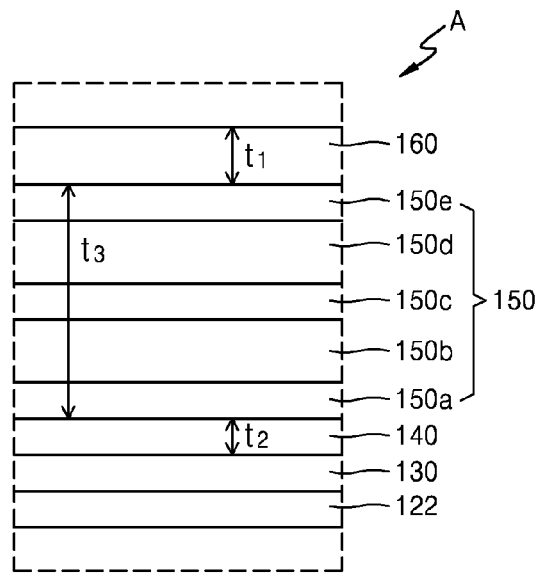
FIG. 2 is a sectional view of area A of FIG. 1, according to exemplary embodiments.

FIG. 1 is a schematic sectional view of an organic light emitting display apparatus 1, according to exemplary embodiments, and FIG. 2 is a sectional view of area A of FIG. 1, according to exemplary embodiments.

Referring to FIGS. 1 and 2, the organic light emitting display apparatus 1 according to exemplary embodiments includes a substrate 110 divided into emission areas EA1, EA2, and EA3 and a non-emission area NA, pixel electrodes 120a, 120b, and 120c disposed on the emission areas EA1, EA2, and EA3 of the substrate 110, intermediate layers 121a, 121b, and 121c, which are disposed on the pixel electrodes 120a, 120b, and 120c and include organic emission layers, and a counter electrode 122, which is disposed on the emission areas EA1, EA2, and EA3 and the non-emission area NA to cover the intermediate layers 121a, 121b, and 121c.

An external light reflection layer 140, configured to reflect at least a portion of incident visible rays and absorb and transmit at least a portion of the incident visible rays, is disposed on the counter electrode 122 commonly onto the emission areas EA1, EA2, and EA3 and the non-emission area NA. A phase control layer 130 is disposed between the counter electrode 122 and the external light reflection layer 140.

A thin-film encapsulating layer 150 is disposed on the external light reflection layer 140, and a black matrix 160 is disposed at an area of the thin-film encapsulating layer 150 corresponding to the non-emission area NA.

The substrate 110 may be a thin-film transistor array substrate, which is formed by arranging driving elements, such as thin-film transistors (TFT), on a base substrate (not shown), where the base substrate may be a flexible substrate. For example, the base substrate may be formed of a plastic material with excellent or high heat resistance and durability, such as polyimide, polyethylene Terephthalate (PET), polycarbonate, polyethylene naphtalate, polyarylate (PAR), and polyetherimide.

The substrate 110 is divided into the emission areas EA1, EA2, and EA3 and the non-emission area NA, and the emission areas EA1, EA2, and EA3 may include sub-pixel areas respectively configured to emit lights of different colors. For example, the emission areas EA1, EA2, and EA3 may respectively include a red sub-pixel EA1, a green sub-pixel EA2, and a blue sub-pixel EA3, which respectively are configured to emit a red light, a green light, and a blue light. However, exemplary embodiments are not limited thereto.

The pixel electrodes 120a, 120b, and 120c may be reflective electrodes including reflective layers. For example, a reflective layer may include at least one of silver (Ag), magnesium (Mg), aluminum (Al), platinum (Pt), palladium (Pd), gold (Au), nickel (Ni), neodymium (Nd), iridium (Ir), and chrome (Cr), and a transparent or semi-transparent electrode layer formed of a material at least one of indium tin oxide (ITO), indium zinc oxide (IZO), zinc oxide (ZnO), indium oxide ($In_2O_3$), indium gallium oxide (IGO), and aluminum zinc oxide (AZO) may be further disposed on the reflective layer. For example, each of the pixel electrodes 120a, 120b, and 120c may consist of three layers of ITO/Ag/ITO.

Two opposite edges of each of the pixel electrode 120a, 120b, 120c may be covered by a pixel defining layer 111 The pixel defining layer 111 may define sub-pixel areas, that is, the emission areas EA1, EA2, and EA3.

The intermediate layers 121a, 121b, and 121c may be disposed at portion of the pixel electrodes 120a, 120b, and 120c exposed by the pixel defining layer 111. Each of the intermediate layers 121a, 121b, and 121c may include an organic emission layer (not shown) and may further include at least one of a hole injection layer (HIL), a hole transport layer (HTL), an electron transport layer (ETL), and an electron injection layer (EIL). However, exemplary embodiments are not limited thereto, and the intermediate layers 121a, 121b, and 121c may further include various function layers.

Meanwhile, if an organic light emitting device (OLED) is a full-color OLED, organic emission layers may be patterned into a red emission layer, a green emission layer, and a blue emission layer, implementing red sub-pixels, green sub-pixels, and blue sub-pixels. However, exemplary embodiments are not limited thereto.

An organic emission layer may have a multi-layer structure, in which a red emission layer, a green emission layer, and a blue emission layer are stacked, or a single layer structure containing a red light-emitting material, a green light-emitting material, and a blue light-emitting material, in order to emit white light. In such case, the OLED may further include a red color filter, a green color filter, and a blue color filter to emit lights of full colors.

The counter electrode 122 may be disposed to be common to the emission areas EA1, EA2, and EA3 and the non-emission area NA and may be a semi-transparent electrode, which is configured to transmit a portion of a light and reflect another portion of the light.

The counter electrode 122 may be formed of a material with low extinction coefficient and high reflectance, wherein a product of a refraction index and an extinction coefficient is equal to or less than 10. For example, the counter electrode 122 may include at least one material of silver (Ag), aluminum (Al), ytterbium (Yb), titanium (Ti), magnesium (Mg), nickel (Ni), lithium (Li), calcium (Ca), copper (Cu), LiF/Ca, LiF/Al, MgAg, and CaAg. The counter electrode 122 may be partially transmissive by being formed as a thin-film having a thickness from several nm to dozens of nm.

By forming the counter electrode 122 as a semi-transparent electrode, the pixel electrodes 120a, 120b, and 120c and the counter electrode 122 may form a micro cavity structure. In other words, a portion of light emitted from the intermediate layers 121a, 121b, and 121c, disposed between the pixel electrodes 120a, 120b, and 120c and the counter electrode 122, may be reflected between the pixel electrodes 120a, 120b, and 120c and the counter electrode 122 traveling back and forth, and a light having a particular wavelength satisfying constructive interference conditions may be amplified from the traveling back and forth as described above and be emitted toward the counter electrode 122.

The intermediate layer 121a, 121b, and 121c may further include a resonance distance adjusting layer (not shown), disposed above and/or below organic emission layers, configured to adjust distances between the pixel electrodes 120a, 120b, and 120c and the counter electrode 122 based on wavelengths of lights emitted by the organic emission layers.

The phase control layer 130 and the external light reflection layer 140 are sequentially disposed on the counter electrode 122. The phase control layer 130 and the external light reflection layer 140 may be disposed not only in the emission areas EA1, EA2, and EA3, but also in the non-emission area NA.

The external light reflection layer 140 may be formed of a material, wherein a product of a refraction index and an extinction coefficient of the material is equal to or higher than 1. For example, the external light reflection layer 140 may include at least one of chrome (Cr), molybdenum (Mo), titanium (Ti), cobalt (Co), nickel (Ni), aluminum (Al), tungsten (W), $CrN_x$, $TiN_x$, $TiAlN_x$, $MoO_x$, and $CuO_x$ (x may be an integer greater than or equal to 1).

A portion of a light incident from outside may be reflected by the external light reflection layer 140, another portion of the light may be absorbed thereby, and the other portion of the light may be transmitted therethrough. The external light reflection layer 140 is formed of a material, wherein the product of a refraction index and an extinction coefficient is equal to or higher than 1, where the material may exhibit relatively low reflectance and relatively high light extinction coefficient compared to other metals.

Therefore, a portion of a light incident from outside may be primarily absorbed by the external light reflection layer 140, and thus reflection of external light may be prevented or reduced.

Thickness t2 of the external light reflection layer 140 may be less than or equal to 0.01 μm. Since the external light reflection layer 140 is disposed in the emission areas EA1, EA2, and EA3 as well as the non-emission area NA, lights emitted by the intermediate layers 121a, 121b, and 121c are transmitted through the external light reflection layer 140 and emitted to outside. Therefore, by forming the external light reflection layer 140 to have a thickness t2 less than or equal to 0.01 μm, transmittance of a light incident to the external light reflection layer 140 may be improved.

An external light incident to the external light reflection layer 140 from outside and transmitted through the external light reflection layer 140 may be reflected by the counter electrode 122. The light reflected by the counter electrode 122 and a light reflected by the external light reflection layer 140 may be configured to destructive interfere each other. Therefore, reflection of an external light may be further prevented or reduced. Detailed descriptions thereof will be given below.

The phase control layer 130 is disposed between the counter electrode 122 and the external light reflection layer 140. The phase control layer 130 is configured to adjust a distance between the counter electrode 122 and the external light reflection layer 140, thereby inducing destructive interference between a light reflected by the counter electrode 122 and a light reflected by the external light reflection layer 140.

The phase control layer 130 may be a transparent thin-film including at least one of $SiN_x$, $SiO_2$, SiCN, LiF, $MgF_2$, $CaF_2$, SiON, $Ta_xO_y$, and $TiO_x$ (x may be an integer greater than or equal to 1). However, exemplary embodiments are not limited thereto.

The thin-film encapsulating layer 150 may be disposed on the external light reflection layer 140. The thin-film encapsulating layer 150 may include inorganic layers 150a, 150c, and 150e and organic layers 150b and 150d alternately disposed, where the overall thickness t3 of the thin-film encapsulating layer 150 may be from about 2 μm to about 20 μm.

The inorganic layers 150a, 150c, and 150e may be formed of at least one of a metal oxide, a metal nitride, and a metal carbide; e.g., an aluminum oxide, a silicon oxide, and/or a silicon nitride. The inorganic layers 150a, 150c, and 150e are configured to prevent or reduce penetration of external moisture and/or oxygen into the intermediate layers 121a, 121b, and 121c.

The organic layers 150b and 150d may be formed of an organic polymer material and may contain at least one of epoxy, acrylate, and urethane acrylate. The organic layers 150b and 150d are configure to lower or reduce internal stresses of the inorganic layers 150a, 150c, and 150e, cover defects of the inorganic layers 150a, 150c, and 150e, and planarize the inorganic layers 150a, 150c, and 150e.

The organic light emitting display apparatus 1 according to exemplary embodiments may include a flexible base substrate (not shown) and include the thin-film encapsulating layer 150 for encapsulation. Therefore, the organic light emitting display apparatus may be embodied as a flexible display apparatus.

If the overall thickness t3 of the thin-film encapsulating layer 150 is less than about 2 μm, the thin-film encapsulating layer 150 may not show competent encapsulation function. If the overall thickness t3 of the thin-film encapsulating layer 150 exceeds about 20 μm, the organic light emitting display apparatus 1 may not be sufficiently flexible.

The black matrix 160 may be disposed at an area on the thin-film encapsulating layer 150 corresponding to the non-emission area NA. An overcoat layer 171 is disposed on the thin-film encapsulating layer 150 to cover the black matrix 160, and a window 172 may be disposed on the overcoat layer 171. The organic light emitting display apparatus 1 according to exemplary embodiments may be free of a polarizer, which is generally and conventionally used for preventing reflection of an external light.

The black matrix 160 is disposed over portions of the phase control layer 130 and the external light reflection layer 140, where thickness t1 of the black matrix 160 may be from about 0.01 μm to about 3 μm.

If the thickness t1 of the black matrix 160 is less than 0.01 μm, the black matrix 160 may not have significantly insufficient light absorbance. If the thickness t1 of the black matrix 160 exceeds 3 μm, the organic light emitting display apparatus 1 may not be sufficiently flexible.

The organic light emitting display apparatus 1 according to exemplary embodiments may efficiently prevent or reduce reflection of an external light using double prevention units including the external light reflection layer 140 and the black matrix 160 in the non-emission area NA.

In a comparative embodiment in which only the black matrix 160 is disposed without the external light reflection layer 140, reflection of an external light in the emission areas EA1, EA2, and EA3 may not be prevented or reduced, and the black matrix should be formed significantly thicker to prevent or reduce reflection of an external light in the non-emission area NA. Therefore, the significantly thicker black matrix may reduce the flexibly of the display apparatus.

In another comparative embodiment in which only the external light reflection layer 140 is disposed without the black matrix 160, the interface reflection occurring at interfaces between the inorganic layers 150a, 150c, and 150e and the organic layers 150b and 150d of the thin-film encapsulating layer 150 may not be prevented or reduced. Furthermore, since an external light reflected on the driving elements and/or the wirings included in the thin-film transistor array substrate 110 will have a difference in optical path length longer than coherence length, reflection of an external light may not be sufficiently prevented or reduced by the external light reflection layer 140 only.

The organic light emitting display apparatus 1 according to exemplary embodiments may sufficiently prevent or reduce reflection of an external light without a polarizer, which has generally a thickness equal to or greater than 100 μm, and thus, the organic light emitting display apparatus may have improved flexibility.

Figure 3A:
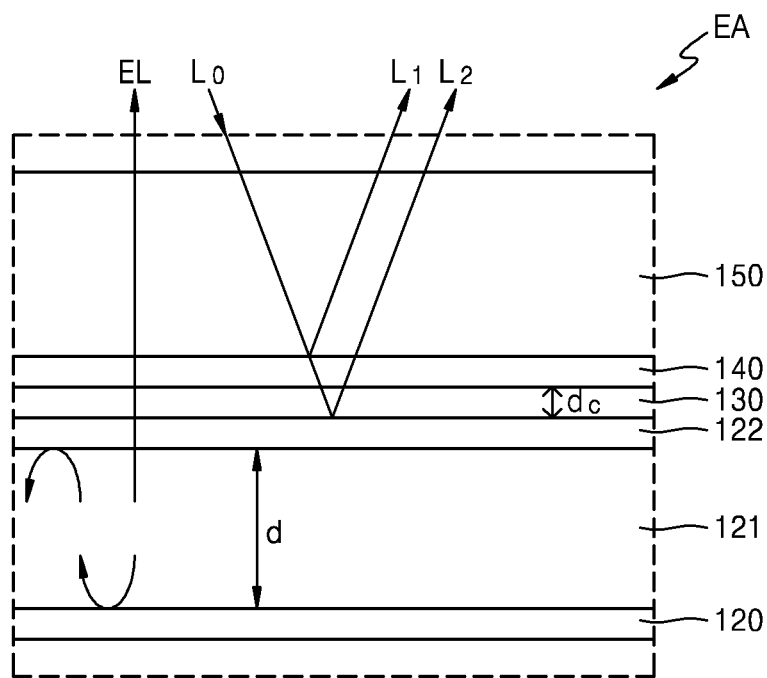
FIGS. 3A and 3B are respective diagrams of mechanisms for preventing reflection of an external light at an emission area and a non-emission area of FIG. 1, according to exemplary embodiments.
Figure 3B:
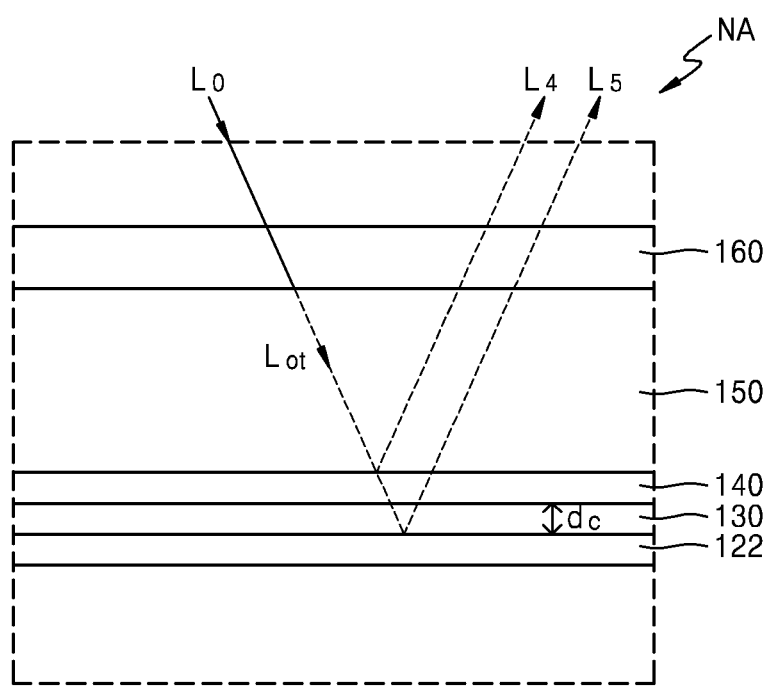

FIGS. 3A and 3B are respective diagrams of mechanisms for preventing reflection of an external light in the emission area EA and the non-emission area NA of FIG. 1, according to exemplary embodiments.

FIG. 3A shows the mechanism for preventing reflection of an external light in the emission area EA, where a light $L_0$ incident from outside may be reflected by the external light reflection layer 140 and the counter electrode 122. Lights $L_1$ and $L_2$ reflected by the external light reflection layer 140 and the counter electrode 122 may destructively interfere each other, thereby extinguishing light reflected to outside.

The phase control layer 130 may adjust a distance $d_c$ between the external light reflection layer 140 and the counter electrode 122, so that phase difference between the light $L_1$ reflected by the external light reflection layer 140 and the light $L_2$ reflected by the counter electrode 122 becomes from about 160 degrees to about 200 degrees to induce destructive interference.

The pixel electrode 120 and the counter electrode 122 forms a micro cavity structure, where a distance d between a pixel electrode 120 and the counter electrode 122 may be set, such that a light emitted by an intermediate layer 121 may be reflected by the pixel electrode 120 and the counter electrode 122, traveling back and forth between the pixel electrode 120 and the counter electrode 122, and the light may be constructively interfered.

A light $E_L$ emitted from the intermediate layer 121 may be amplified via the constructive interference, be transmitted through the counter electrode 122, and may be emitted to outside. According to exemplary embodiments, the organic light emitting display apparatus (1 of FIG. 1) may be formed free of a polarizer, no light is absorbed by a polarizer, and thus optical efficiency may be improved. Detailed descriptions thereof will be given below.

FIG. 3B shows the mechanism for preventing reflection of an external light in the non-emission area NA, where a portion of a light $L_0$ incident from outside may be absorbed by the black matrix 160, and the other portion of the light $L_{ot}$ may be transmitted through the black matrix 160 and reflected by the external light reflection layer 140 and the counter electrode 122.

Lights $L_4$ and $L_5$ reflected by the external light reflection layer 140 and the counter electrode 122 may destructively interfere each other, thereby extinguishing light reflected to outside. Furthermore, since lights reflected by the external light reflection layer 140 and the counter electrode 122 travel through the black matrix 160 again, the reflected lights are absorbed by the black matrix 160, and thus reflection of an external light may be further reduced.

The phase control layer 130 may adjust a distance $d_c$ between the external light reflection layer 140 and the counter electrode 122, so that phase difference between the light $L_4$ reflected by the external light reflection layer 140 and the light $L_5$ reflected by the counter electrode 122 becomes from about 160 degrees to about 200 degrees to induce destructive interference.

Figure 4:
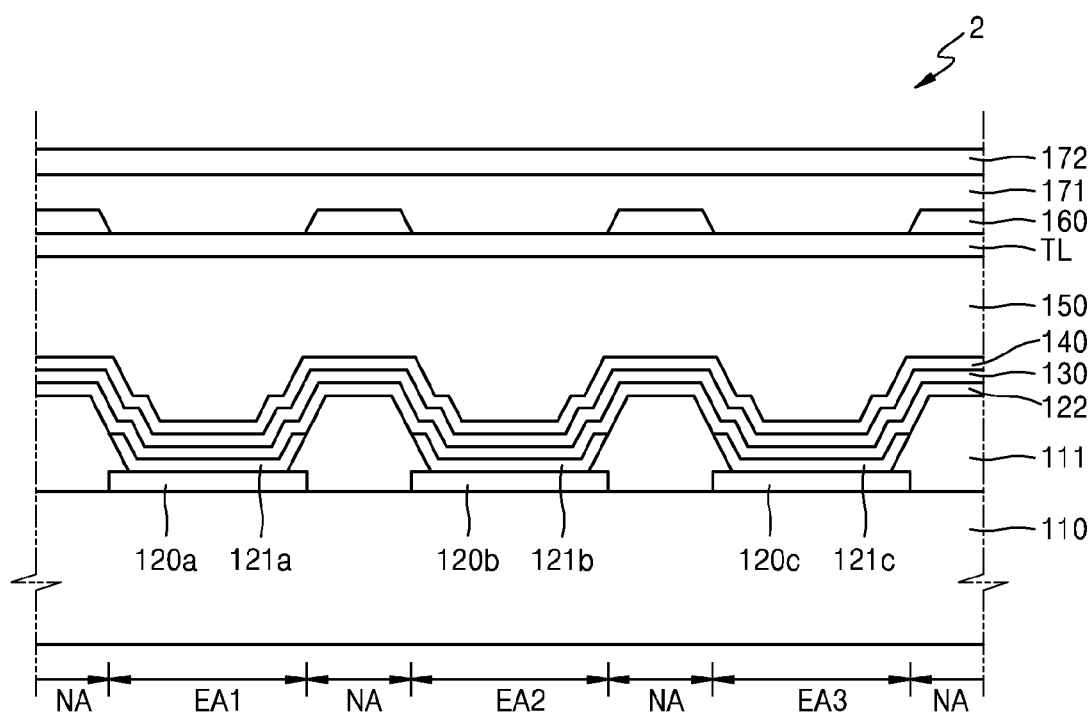
FIGS. 4, 5, and 6 are schematic sectional views of organic light emitting display apparatuses, according to exemplary embodiments.
Figure 5:
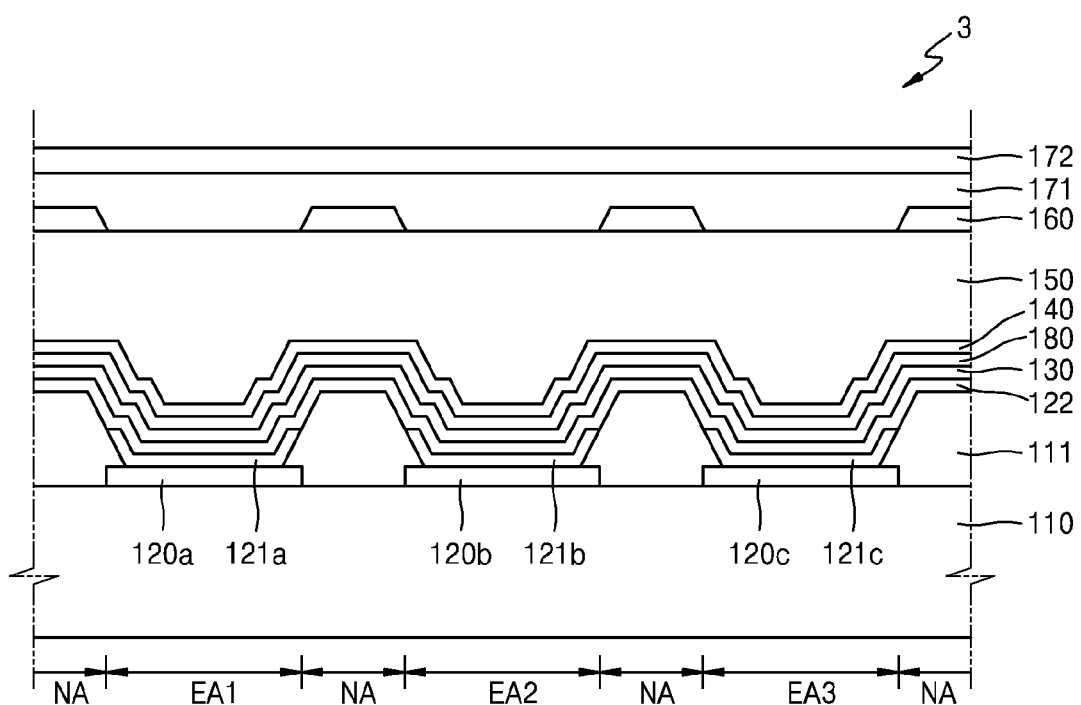
Figure 6:
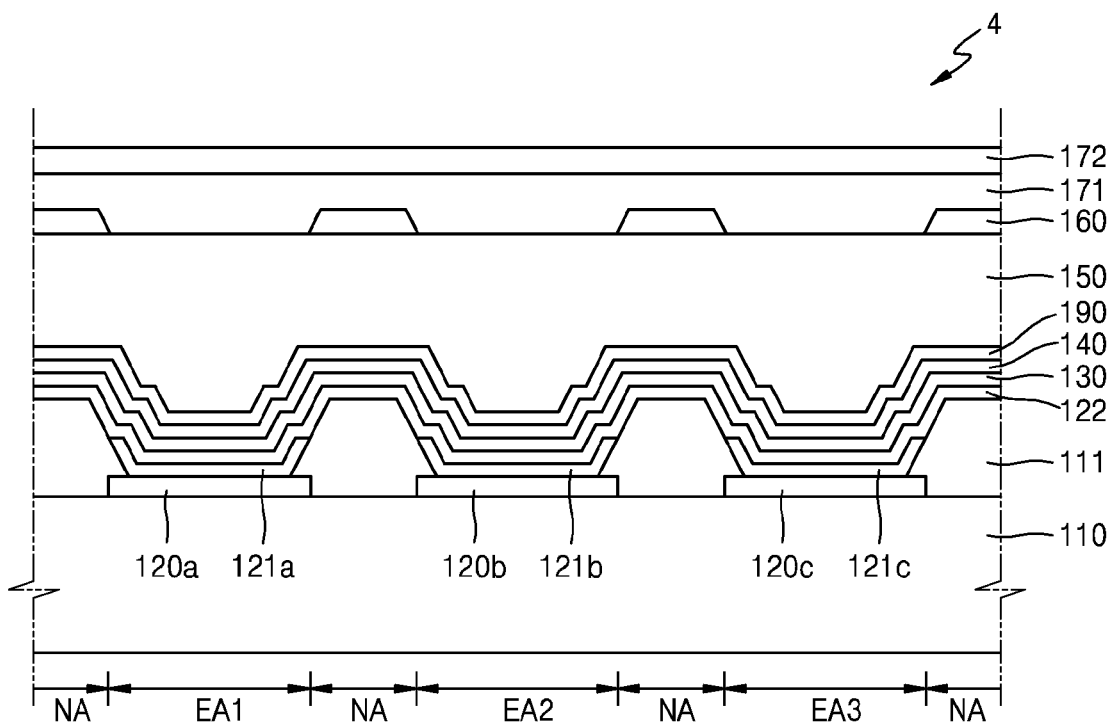

FIGS. 4, 5, and 6 are schematic sectional views of organic light emitting display apparatuses according to exemplary embodiments.

Referring to FIG. 4, an organic light emitting display apparatus 2 according to exemplary embodiments includes a substrate 110 divided into emission areas EA1, EA2, and EA3 and a non-emission area NA, pixel electrodes 120a, 120b, and 120c disposed on the emission areas EA1, EA2, and EA3 of the substrate 110, intermediate layers 121a, 121b, and 121c, which are disposed on the pixel electrodes 120a, 120b, and 120c and include organic emission layers, and a counter electrode 122, which is disposed on the emission areas EA1, EA2, and EA3 and the non-emission area NA to cover the intermediate layers 121a, 121b, and 121c.

An external light reflection layer 140, configured to reflect at least a portion of incident visible rays, and absorb and transmit at least a portion of the incident visible rays, is disposed on the counter electrode 122 commonly onto the emission areas EA1, EA2, and EA3 and the non-emission area NA. A phase control layer 130 is disposed between the counter electrode 122 and the external light reflection layer 140.

A thin-film encapsulating layer 150 is disposed on the external light reflection layer 140, and a black matrix 160 is disposed at an area of the thin-film encapsulating layer 150 corresponding to the non-emission area NA. A touch layer TL may be disposed between the thin-film encapsulating layer 150 and the black matrix 160.

The organic light emitting display apparatus 2 according to exemplary embodiments includes the touch layer TL, and thus the organic light emitting display apparatus 2 may have touch function. In other words, a location in a displayed image may be designated based on a user touch applied from outside.

The touch layer TL may contain a conductive material and may be formed by forming a conductive material on the topmost layer of the thin-film encapsulating layer 150, e.g., an inorganic layer (150e of FIG. 2), without a base film and patterning the same. Since the touch layer TL may be formed free of a base film, the touch layer TL may be formed to have a relatively thin thickness compared to a conventional touch screen panel. Therefore, the organic light emitting display apparatus 2 having touch function according to exemplary embodiments may have reduced thickness.

The black matrix 160 is disposed at an area on the touch layer TL corresponding to the non-emission area NA, and may efficiently prevent or reduce reflection of an external light due to a metal pattern included in the touch layer TL.

An organic light emitting display apparatus according to exemplary embodiments may include a touch panel disposed on the black matrix 160. Since the touch panel includes a base film, the overall thickness may generally be 50 μm or greater. If a black matrix is disposed on a touch panel, color shift may occur based on a viewing angle due to thickness of the touch panel. To prevent such a problem, the touch panel may be disposed on the black matrix.

The other configuration of the organic light emitting display apparatus 2 may be identical to those included in the organic light emitting display apparatus 1 of FIG. 1, and thus, are omitted.

Referring to FIG. 5, an organic light emitting display apparatus 3 according to exemplary embodiments includes a substrate 110 divided into emission areas EA1, EA2, and EA3 and a non-emission area NA, pixel electrodes 120a, 120b, and 120c disposed on the emission areas EA1, EA2, and EA3 of the substrate 110, intermediate layers 121a, 121b, and 121c, which are disposed on the pixel electrodes 120a, 120b, and 120c and include organic emission layers, and a counter electrode 122, which is disposed on the emission areas EA1, EA2, and EA3 and the non-emission area NA to cover the intermediate layers 121a, 121b, and 121c.

An external light reflection layer 140, configured to reflect at least a portion of incident visible rays, and absorb and transmit at least a portion of the incident visible rays, is disposed on the counter electrode 122 commonly onto the emission areas EA1, EA2, and EA3 and the non-emission area NA. A phase control layer 130 is disposed between the counter electrode 122 and the external light reflection layer 140.

A thin-film encapsulating layer 150 is disposed on the external light reflection layer 140, and a black matrix 160 is disposed on an area of the thin-film encapsulating layer 150 corresponding to the non-emission area NA. A protection layer 180 may be disposed between the phase control layer 130 and the external light reflection layer 140.

The protection layer 180 is configured to prevent or reduce damage to the intermediate layers 121a, 121b, and 121c from plasma used for forming the external light reflection layer 140 via sputtering. The protection layer 180 may be formed of a highly chemical-resistant material and, more particularly, a material with low plasma reactivity. According to exemplary embodiments, the protection layer 180 may include at least one of LiF, $MoO_x$, $WoO_x$, and $SiN_x$ (x may be an integer greater than or equal to 1).

The other configuration of the organic light emitting display apparatus 3 referring to FIG. 5 may be identical to those included in the organic light emitting display apparatus 1 of FIG. 1.

Referring to FIG. 6, an organic light emitting display apparatus 4 according to exemplary embodiments includes a substrate 110 divided into emission areas EA1, EA2, and EA3 and a non-emission area NA, pixel electrodes 120a, 120b, and 120c disposed on the emission areas EA1, EA2, and EA3 of the substrate 110, intermediate layers 121a, 121b, and 121c, which are disposed on the pixel electrodes 120a, 120b, and 120c and include organic emission layers, and a counter electrode 122, which is disposed on the emission areas EA1, EA2, and EA3 and the non-emission area NA to cover the intermediate layers 121a, 121b, and 121c.

An external light reflection layer 140, configured to reflect at least a portion of incident visible rays, and absorb and transmit at least a portion of the incident visible rays, is disposed on the counter electrode 122 commonly onto the emission areas EA1, EA2, and EA3 and the non-emission area NA. A phase control layer 130 is disposed between the counter electrode 122 and the external light reflection layer 140.

A thin-film encapsulating layer 150 is disposed on the external light reflection layer 140, and a black matrix 160 is disposed on an area of the thin-film encapsulating layer 150 corresponding to the non-emission area NA. An interface reflection reducing layer 190 may be disposed between the external light reflection layer 140 and the thin-film encapsulating layer 150.

The interface reflection reducing layer 190 is configured to reduce possible interface reflection at the interface between the external light reflection layer 140 and the thin-film encapsulating layer 150. The interface reflection reducing layer 190 may have refraction index between a refraction index of the external light reflection layer 140 and a refraction index of the bottommost layer (150a of FIG. 2) included in the thin-film encapsulating layer 150.

The interface reflection at the interface between the external light reflection layer 140 and the thin-film encapsulating layer 150 may be increased as the difference between refraction index of the external light reflection layer 140 and refraction index of the bottommost layer (150a of FIG. 2) included in the thin-film encapsulating layer 150 increases. Therefore, interface reflection may be reduced by arranging the interface reflection reducing layer 190 between the external light reflection layer 140 and the thin-film encapsulating layer 150.

The other configuration of the organic light emitting display apparatus 4 referring to FIG. 6 may be identical to those included in the organic light emitting display apparatus 1 of FIG. 1.

Figure 7:
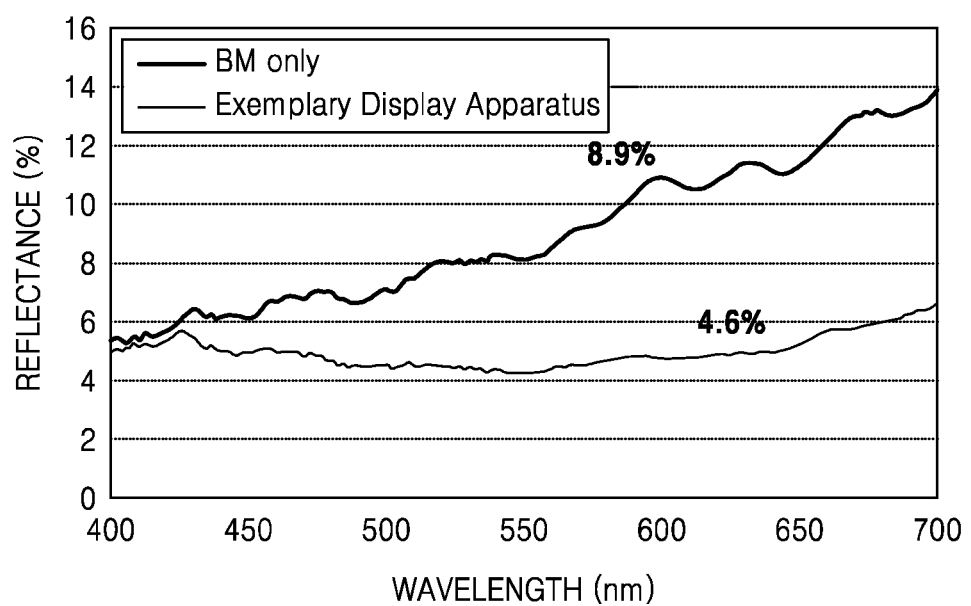
FIG. 7 is a graph showing a comparison of an external light reflectance at a non-emission area of the organic light emitting display apparatus of FIG. 1 to a case in which only a black matrix is utilized.

FIG. 7 is a graph showing a comparison of an external light reflectance at non-emission areas of the organic light emitting display apparatus 1 of FIG. 1 to a case in which only a black matrix is utilized.

The graph shown in FIG. 7 shows an external light reflectance at a non-emission area NA when thickness t1 of the black matrix (160 of FIG. 1) is 300 nm in the organic light emitting display apparatus 1 according to the exemplary embodiment shown in FIG. 1 and in the comparative embodiment where only a black matrix having a thickness of 300 nm is disposed without the external light reflection layer 140 according to wavelengths.

Referring to the graph, in the organic light emitting display apparatus according to the exemplary embodiment shown in FIG. 1, even with small thickness t1 of the black matrix 160, may have the external light reflectance around 5%. However, the comparative embodiment shows relatively high external light reflectance with only the black matrix 160 is disposed.

Figure 8A:
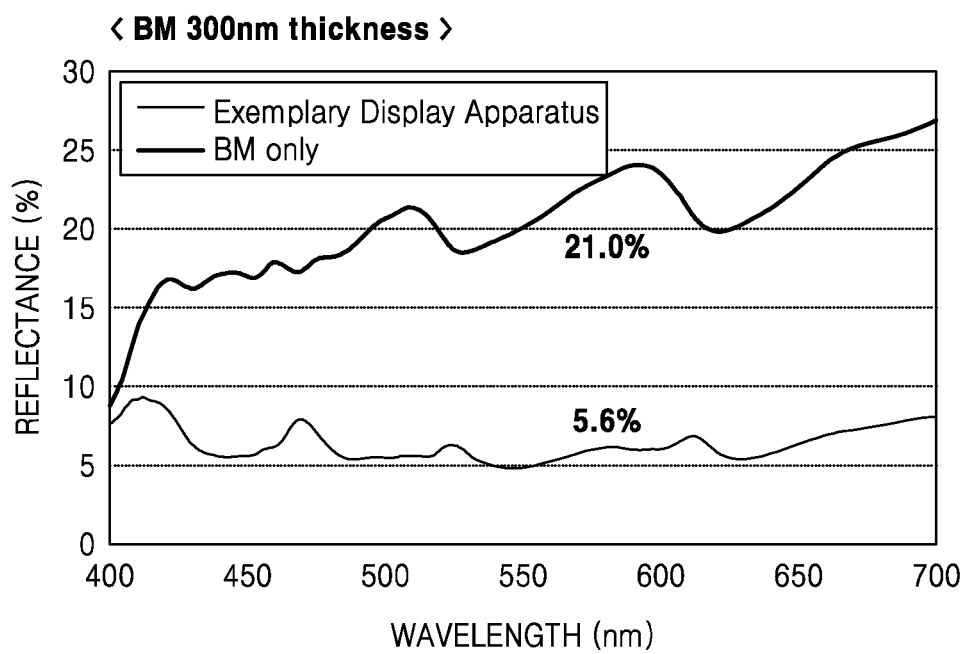
FIGS. 8A and 8B are graphs showing comparisons of external light reflectance of the organic light emitting display apparatus of FIG. 1 to a case in which only a black matrix is utilized.
Figure 8B:
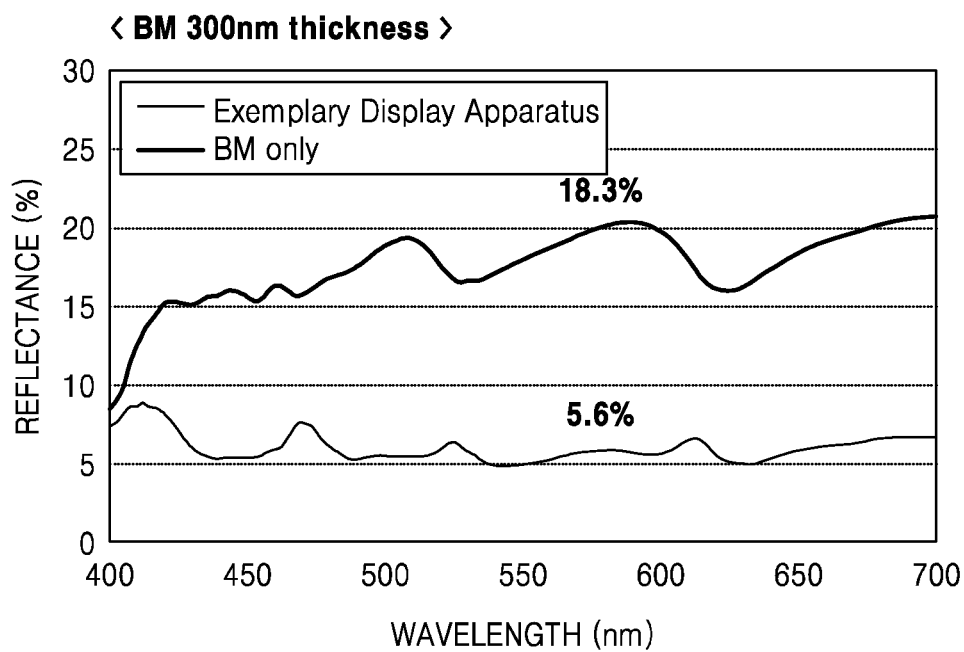

FIGS. 8A and 8B are graphs showing comparisons of the external light reflectance of the organic light emitting display apparatus of FIG. 1 to a case in which only a black matrix is utilized.

More specifically, the graphs shown in FIGS. 8A and 8B respectively show external light reflectance of the organic light emitting display apparatus 1 and the comparative embodiment, when the thickness t1 of the black matrix (160 of FIG. 1) is 300 nm and 3000 nm, respectively.

Referring to the graphs, external light reflectance of the overall organic light emitting display apparatus 1 is maintained around 5% in the organic light emitting display apparatus 1 according to the exemplary embodiment shown in FIG. 1 for both cases illustrated in FIGS. 8A and 8B. However, the comparative embodiment shows that the overall external light reflectance values are about 21% and about 18% for each case illustrated in FIGS. 8A and 8B, respectively. Therefore, it is clear that external light reflection is not efficiently prevented or reduced in the cases where only the black matrixes 160 are disposed without the external light reflection layer 140.

The external light reflection is high in the case where only the black matrix 160 is disposed because an amount of light transmitted through the black matrix 160 increases due to insufficient thickness t1 of the black matrix 160, and there is no structure configured to prevent or reduce external light reflection in the emission areas EA1, EA2, and EA3, reflected by the structures such as counter electrode (122 of FIG. 1).

Figure 9A:
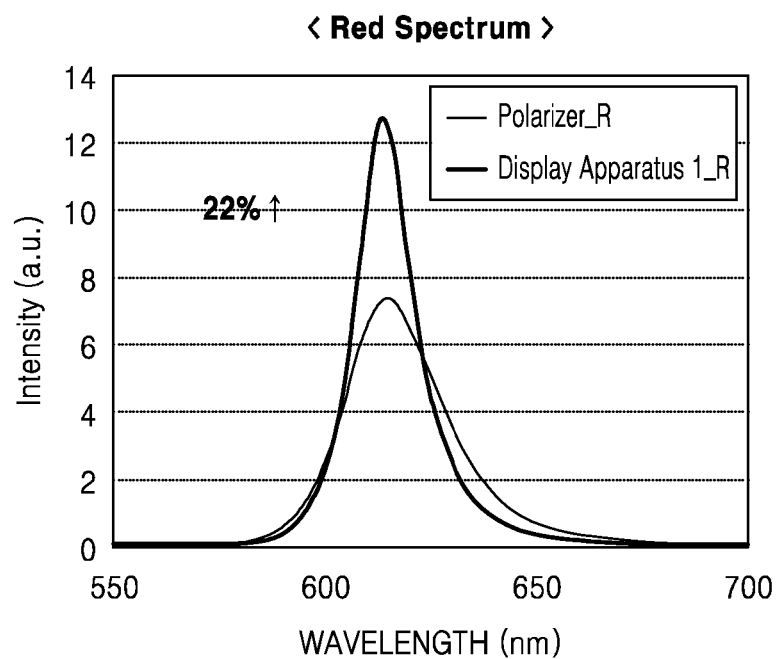
FIGS. 9A, 9B, and 9C are graphs showing comparisons between intensities of lights emitted from a red (R) sub-pixel, a green (G) sub-pixel, and a blue (B) sub-pixel included in the organic light emitting display apparatus of FIG. 1 to those cases where polarizers are utilized.
Figure 9B:
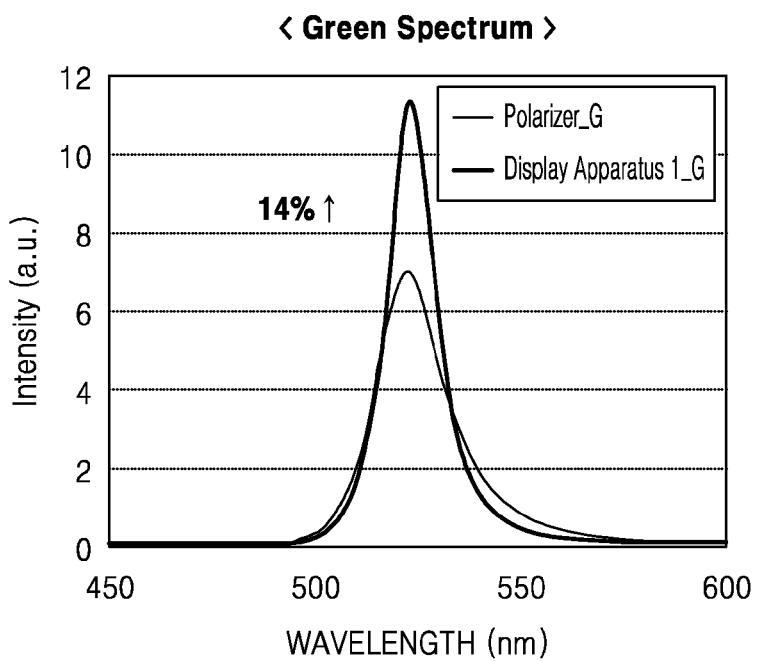
Figure 9C:
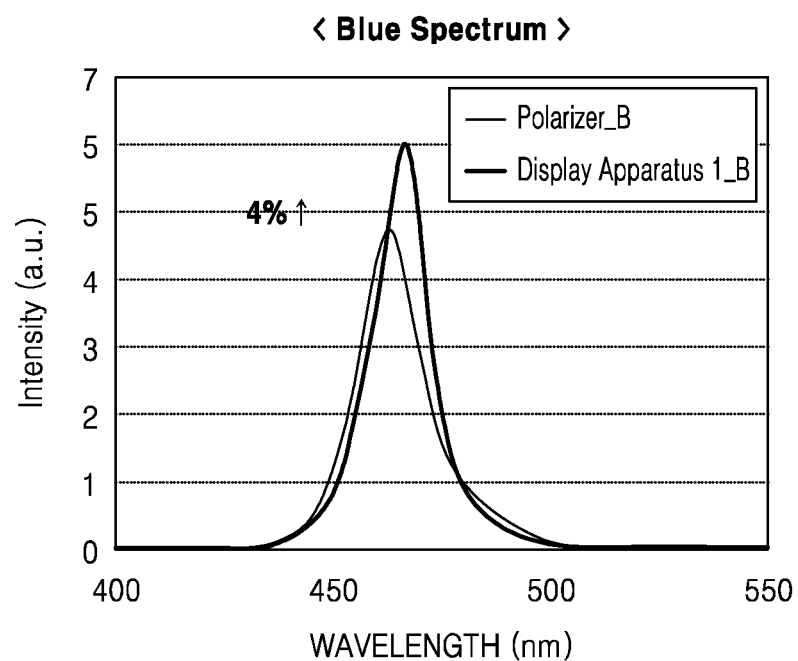

FIGS. 9A, 9B, and 9C are graphs showing comparisons intensities of lights (in arbitrary units, hereinafter a.u.) emitted from a red (R) sub-pixel, a green (G) sub-pixel, and a blue (B) sub-pixel included in the organic light emitting display apparatus of FIG. 1 to those cases where polarizers are utilized.

Referring to FIGS. 9A, 9B, and 9C, intensities of lights emitted from a red (R) sub-pixel, a green (G) sub-pixel, and a blue (B) sub-pixel included in the organic light emitting display apparatus 1 according to the exemplary embodiment shown in FIG. 1 are increased by about 22%, about 14%, and about 4% compared to the comparative embodiment where the polarizer is disposed, respectively. Efficiency of white light embodied based on the above-stated configuration may increase by about 6% compared to the comparative embodiment where the polarizer is disposed.

In other words, the organic light emitting display apparatus 1 according to exemplary embodiment includes the external light reflection layer 140, and the external light reflection layer 140 may efficiently prevent or reduce reflection of an external light while absorbing less light emitted from the organic light emitting display apparatus 1 than including a polarizer.

Each of the organic light emitting display apparatuses 1, 2, 3, and 4 according to exemplary embodiments includes the relatively thin black matrix 160 and external light reflection layer 140 without a polarizer. Therefore, the display apparatus may have improved flexibility. Furthermore, reflection of an external light may be reduced, thereby improving visibility and optical efficiency of a display apparatus.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light emitting display apparatus comprising:
   a substrate divided into an emission area and a non-emission area;
   a pixel electrode disposed in the emission area;
   an intermediate layer disposed on the pixel electrode, the intermediate layer comprising an organic emission layer;
   a counter electrode disposed in the emission area and the non-emission area, the counter electrode covering the intermediate layer;
   an external light reflection layer disposed on the counter electrode in the emission area and the non-emission area, the external light reflection layer being configured to:
      reflect a portion of incident visible rays; and
      absorb and transmit another portion of the incident visible rays;
   a phase control layer disposed between the counter electrode and the external light reflection layer, the phase control layer being configured to control a phase of light reflected by the counter electrode to destructively interfere with light reflected by the external light reflection layer;

a thin-film encapsulating layer disposed on the external light reflection layer; and a black matrix disposed on the thin-film encapsulating layer in the non-emission area.

2. The organic light emitting display apparatus of claim 1, wherein:
the black matrix is partially disposed over the phase control layer and the external light reflection layer; and
the black matrix is about 0.01 μm to about 3 μm thick.

3. The organic light emitting display apparatus of claim 2, wherein the external light reflection layer is less than or equal to 0.01 μm thick.

4. The organic light emitting display apparatus of claim 2, wherein:
the thin-film encapsulating layer comprises an inorganic layer and an organic layer; and
a maximum thickness of the thin-film encapsulating layer is about 2 μm to about 20 μm.

5. The organic light emitting display apparatus of claim 1, wherein a product of an index of refraction of the external light reflection layer and an extinction coefficient of the external light reflection layer is equal to or greater than 1.

6. The organic light emitting display apparatus of claim 5, wherein:
the external light reflection layer comprises at least one of chrome (Cr), molybdenum (Mo), titanium (Ti), cobalt (Co), nickel (Ni), aluminum (Al), tungsten (W), $CrN_x$, $TiN_x$, $TiAlN_x$, $MoO_x$, and $CuO_x$, "x" being an integer greater than or equal to 1.

7. The organic light emitting display apparatus of claim 1, wherein the phase control layer comprises at least one of $SiN_x$, $SiO_2$, SiCN, LiF, $MgF_2$, $CaF_2$, SiON, $Ta_xO_y$, and $TiO_x$, "x" being an integer greater than or equal to 1.

8. The organic light emitting display apparatus of claim 1, further comprising:
a protection layer disposed between the phase control layer and the external light reflection layer.

9. The organic light emitting display apparatus of claim 8, wherein the protection layer comprises at least one of LiF, $MoO_x$, $WoO_x$, and $SiN_x$, "x" being an integer greater than or equal to 1.

10. The organic light emitting display apparatus of claim 1, further comprising:
an interface reflection reducing layer disposed between the external light reflection layer and the thin-film encapsulating layer.

11. The organic light emitting display apparatus of claim 1, further comprising:
a touch layer disposed between the thin-film encapsulating layer and the black matrix.

12. The organic light emitting display apparatus of claim 1, wherein:
the counter electrode is semi-transparent; and
a product of an index of refraction of the counter electrode and an extinction coefficient of the counter electrode is less than or equal to 10.

13. The organic light emitting display apparatus of claim 1, wherein a micro cavity structure is disposed between the pixel electrode and the counter electrode.

14. The organic light emitting display apparatus of claim 13, wherein the micro cavity is configured to:
amplify incident light of a determined wavelength; and
emit the amplified light toward the counter electrode.

15. The organic light emitting display apparatus of claim 11, wherein the touch layer comprises a conductive material.

16. The organic light emitting display apparatus of claim 15, wherein the touch layer is disposed directly on the thin-film encapsulating layer.

* * * * *